United States Patent
Kataoka et al.

(10) Patent No.: US 7,190,934 B2
(45) Date of Patent: Mar. 13, 2007

(54) REFLECTED POWER SUPPRESSION CIRCUIT

(75) Inventors: Shigeru Kataoka, Kawasaki (JP); Shingo Matsuda, Nagaokakyo (JP); Ichiro Kato, Kosai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 360 days.

(21) Appl. No.: 10/983,719

(22) Filed: Nov. 9, 2004

(65) Prior Publication Data

US 2005/0159119 A1    Jul. 21, 2005

(30) Foreign Application Priority Data

Jan. 21, 2004    (JP)    ............... 2004-013547

(51) Int. Cl.
*H04B 1/04* (2006.01)
(52) U.S. Cl. ............... 455/126; 455/127.2; 455/115.2; 330/298
(58) Field of Classification Search ............ 455/114.2, 455/115.1, 115.3, 127.1, 127.2, 126; 330/298
See application file for complete search history.

(56) References Cited

U.S. PATENT DOCUMENTS

| | | | |
|---|---|---|---|
| 3,641,451 A | 2/1972 | Hollingsworth et al. | |
| 4,122,400 A | 10/1978 | Medendorp et al. | |
| 5,038,112 A | 8/1991 | O'Neill | |
| 5,392,464 A * | 2/1995 | Pakonen | 455/115.1 |
| 5,956,627 A * | 9/1999 | Goos | 455/127.1 |
| 2001/0010483 A1 | 8/2001 | Akiya | |
| 2003/0114182 A1 * | 6/2003 | Chan et al. | 455/525 |

FOREIGN PATENT DOCUMENTS

| | | |
|---|---|---|
| EP | 0 404 294 A1 | 12/1990 |
| JP | 6-268536 | 9/1994 |
| JP | 2000-165164 | 6/2000 |
| JP | 2002-76791 | 3/2002 |

\* cited by examiner

*Primary Examiner*—Edward F. Urban
*Assistant Examiner*—Blane J. Jackson
(74) *Attorney, Agent, or Firm*—McDermott Will & Emery LLP

(57) ABSTRACT

An amplifier 3 amplifies a transmission signal, and outputs the amplified signal to an antenna. A directional coupler 6 causes a portion of power passing through a first path connecting the amplifier 3 and the antenna to branch to a second path. A detection section 7 detects an electrical parameter changing with a change in the intensity of power reflected from the antenna to the amplifier 3, thereby detecting the intensity of the reflected power. A control circuit 8 changes a proportion of power caused to branch to the second path by the directional coupler 6, based on the electrical parameter detected by the detection circuit 7. Thus, it is possible to provide a reflected power suppression circuit capable of facilitating size reduction and preventing a power amplifier from being damaged due to breakage of an antenna, while minimizing a power loss at the time of signal transmission.

8 Claims, 6 Drawing Sheets

REFLECTED POWER SUPPRESSION CIRCUIT

BACKGROUND OF THE INVENTION

1. Field of the Invention

The present invention relates to a reflected power suppression circuit. More particularly, the present invention relates to a circuit for preventing power reflected from an antenna from being inputted to a power amplifier.

2. Description of the Background Art

In a portable terminal of a mobile communication device such as a mobile phone and a PHS (Personal Handyphone System), due to its portability and reduced size, an antenna often gets damaged or contact with metal such as a steel plate of a steel desk. With the antenna used in such a condition, if the portable terminal originates a call or changes its state to a communicating state, and radiates a transmission power, the transmission power is reflected from around the antenna, whereby the matching condition between a power amplifier and the antenna is no more satisfied. When the output matching condition of the power amplifier is not satisfied due to the reflected wave power, a load curve of the power amplifier changes, and the power amplifier operates outside of the Area of Safe Operation (ASO) which is set at the design process. As a result, there is a possibility that the power amplifier may be broken or damaged. Thus, an amplifying device structuring the power amplifier used in such a portable terminal is required to have a high degree of immunity against a load change.

In recent years, GaAs-HBT (Hetero junction Bipolar Transistor) has been developed and put into practical use as a power amplifier of the portable terminal for improving device efficiency. However, the GaAs-HBT has a lower degree of immunity against a load change compared to conventional devices such as Si-MOSFET and GaAs-MESFET. As a result, in the case where the antenna is broken, for example, in the portable terminal with the power amplifier to which the GaAs-HBT is applied, there is a high possibility that the power amplifier becomes broken or damaged. Thus, in order to put the GaAs-HBT, which is a high-quality and high-efficiency device, into practical use as a power amplifier of the portable terminal, the GaAs-HBT should be prevented from being damaged by a load change.

As a method for solving the above problem, there exists a portable terminal provided with an isolator inserted between a power amplifier and an antenna. Also, there exists a portable terminal provided with a directional coupler inserted between a power amplifier and an antenna for suppressing a transmission power of the power amplifier based on reflected power outputted from the directional coupler. Hereinafter, with reference to the drawings, these portable terminals will be described. FIG. 8 is a block diagram showing a configuration of a portable terminal provided with the isolator. Also, FIG. 9 is a block diagram showing a configuration of a portable terminal provided with the directional coupler.

First, the portable terminal as shown in FIG. 8 will be described. The portable terminal as shown in FIG. 8 includes an input terminal 101, an output terminal 102, a power amplifier 103, a power supply terminal 104, and an isolator 105. A transmission signal is inputted from the input terminal 101. The power amplifier 103 amplifies the transmission signal, and outputs the amplified signal. The power supply terminal 104 is a terminal through which power for driving the power amplifier 103 is supplied. The isolator 105 outputs the transmission signal outputted from the power amplifier 103 to the output terminal 102, and outputs a signal reflected from the output terminal 102 to the power amplifier 103 to a ground. The output terminal 102 outputs the transmission signal outputted from the isolator 105 to the antenna.

In the portable terminal configured as described above, the power amplifier 103 is prevented from being damaged due to breakage, etc., of the antenna. Detailed descriptions are provided below.

In the portable terminal, breakage, etc., of the antenna increases the power reflected from the antenna to the power amplifier 103. Due to such reflected power, the matching condition between the power amplifier 103 and the antenna may not be satisfied. When the matching condition between the power amplifier 103 and the antenna is not satisfied, a load curve of the power amplifier 103 changes, and the power amplifier 103 operates outside of the ASO which is set at the design process. As a result, the power amplifier 103 becomes damaged.

The power amplifier 103 as shown in FIG. 8 is provided with the isolator 105 inserted between the power amplifier 103 and the output terminal 102. The isolator 105 outputs the reflected power to the ground, whereby the reflected power is not inputted to the power amplifier 103, even if the reflected power is increased due to breakage, etc., of the antenna. Accordingly, the matching condition between the power amplifier 103 and the antenna remains satisfied, and the load curve of the power amplifier 103 remains unchanged. As a result, the power amplifier 103 always operates within the ASO which is set at the design process, and damage to the power amplifier 103 is prevented.

Next, the portable terminal as shown in FIG. 9 will be described. The portable terminal as shown in FIG. 9 includes the input terminal 101, the output terminal 102, the power amplifier 103, the power supply terminal 104, a directional coupler 106, a detection circuit 107, a control circuit 108, and a termination resistor 109. A transmission signal is inputted from the input terminal 101. The power amplifier 103 amplifies the transmission signal, and outputs the amplified signal. The power supply terminal 104 is a terminal through which power for driving the power amplifier 103 is supplied. The directional coupler 106 outputs the transmission signal outputted from the power amplifier 103 to the output terminal 102, and also outputs, to the detection circuit 107, the power reflected from the output terminal 102 to the power amplifier 103. The detection circuit 107 converts the reflected power to a voltage signal, and outputs the voltage signal to the control circuit 108. The control circuit 108 controls the power gain of the power amplifier 103 based on the intensity of the voltage signal.

In the portable terminal configured as described above, damage to the power amplifier 103 caused by a broken antenna, etc., is prevented. Detailed descriptions are provided below.

In the portable terminal, power reflected from the antenna to the power amplifier 103 is increased due to breakage, etc., of the antenna. When reflected power is increased in such a manner, the power amplifier 103 is damaged.

Thus, in the portable terminal as shown in FIG. 9, the directional coupler 106 detects the reflected power, and the detection circuit 107 converts the reflected power to a voltage signal. Furthermore, when the voltage signal is high, the control circuit 108 reduces the power gain of the power amplifier 103. As such, by controlling the power gain of the power amplifier 103, the load curve is controlled so as to be within the Area of Safe Operation, even if the matching condition between the antenna and the power amplifier 103 is not satisfied due to the reflected power. As a result, damage to the power amplifier 103 is prevented.

However, the portable terminal as shown in FIG. 8 has drawbacks in that a size of the terminal cannot be reduced and a power loss occurs in the direction of transmission. Detailed descriptions are provided below.

The isolator is a magnetic circuit. Thus, the size of the isolator cannot be reduced unless the relative permeability of materials of the magnetic circuit is dramatically increased. A commercialized isolator operating at a frequency range of 800 MHz to 2 GHz is generally used in the portable terminal, and a size thereof is a square 5–7 mm on a side. This is equal to or greater than the size of the power amplifier. Thus, the isolator is a great obstacle preventing the portable terminal from being reduced in size. Also, the isolator has constant forward direction transition loss characteristics regardless of the presence or absence of the reflected power. Thus, in the portable terminal, power loss always occurs when a signal is transmitted.

Also, the portable terminal as shown in FIG. 9 has a drawback in that a power loss occurs in the direction of transmission. Specifically, since the directional coupler 106 has a constant degree of coupling, the directional coupler 106 has constant forward direction transition loss characteristics regardless of the presence or absence of the reflected power. As a result, in the portable terminal, power loss always occurs when a signal is transmitted.

Note that the method for preventing the power amplifier from being damaged is also disclosed in Japanese Laid-Open Patent Publication Nos. 6-268536, 2002-76791, and 2000-165164.

SUMMARY OF THE INVENTION

Therefore, an object of the present invention is to provide a reflected power suppression circuit capable of facilitating size reduction and preventing a power amplifier from being damaged due to breakage, etc., of an antenna, while minimizing a power loss at the time of signal transmission.

The present invention has the following features to attain the object mentioned above.

In a reflected power suppression circuit according to the present invention, an amplifier amplifies a transmission signal and outputs the amplified signal to an antenna, a directional coupler causes a portion of power passing through a first path connecting the amplifier and the antenna to branch to a second path which is different from the first path, a detection section detects an electrical parameter changing with a change in an intensity of power reflected from the antenna to the amplifier to detect the intensity of the reflected power, and a control section changes a proportion of the power caused to branch to the second path by the directional coupler, based on the electrical parameter detected by the detection section.

The detection section may detect the intensity of the reflected power by detecting an intensity of power caused to branch to the second path by the directional coupler.

The detection section may detect the intensity of the reflected power by converting the power caused to branch to the second path by the directional coupler to a voltage signal having a voltage value corresponding to the intensity of the branched power and detecting the voltage value of the voltage signal. The control section may comprise a resistor electrically connected to the directional coupler to be used as a termination resistor and having a characteristic impedance, with which a proportion of power caused to branch to the second path by the directional coupler is maximized, a comparison section for comparing a voltage value of the voltage signal detected by the detection section with a predetermined voltage value so as to output a first control signal when the obtained voltage value is greater than the predetermined voltage value, and output a second control signal when the predetermined voltage value is greater than the obtained voltage value, and a switch for electrically connecting the directional coupler and the resistor when the first signal is outputted from the comparison section, and electrically disconnecting the directional coupler and the resistor when the second control signal is outputted from the comparison section.

It is preferable that the switch comprise a diode.

It is preferable that the switch comprise a field effect transistor.

It is preferable that the switch comprise a bipolar transistor.

The detection section may detect the intensity of the reflected power by detecting a level of a consumption current provided to the amplifier.

The detection section may output a voltage signal corresponding to a level of the consumption current. The control section may comprise a resistor electrically connected to the directional coupler to be used as a termination resistor and having a characteristic impedance, with which a proportion of power caused to branch to the second path by the directional coupler is maximized, a comparison section for comparing a voltage value of the voltage signal detected by the detection section with a predetermined voltage value so as to output a first control signal when the obtained voltage value is greater than the predetermined voltage value, and output a second control signal when the predetermined voltage value is greater than the obtained voltage value, and a switch for electrically connecting the directional coupler and the resistor when the first signal is outputted from the comparison section, and electrically disconnecting the directional coupler and the resistor when the second control signal is outputted from the comparison section.

According to the above-described reflected power suppression circuit, the degree of coupling of the directional coupler is changed in accordance with a level of the reflected power. Specifically, in the case where the reflected power is low, the degree of coupling of the directional coupler is controlled to become lower. On the other hand, in the case where the reflected power is high, the degree of coupling of the directional coupler is controlled to become higher. As a result, it is possible to solve a conventional problem that a power loss of the transmission signal occurs when the reflected power is small. Also, no isolator is used, whereby it is possible to realize size reduction of the circuit.

These and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
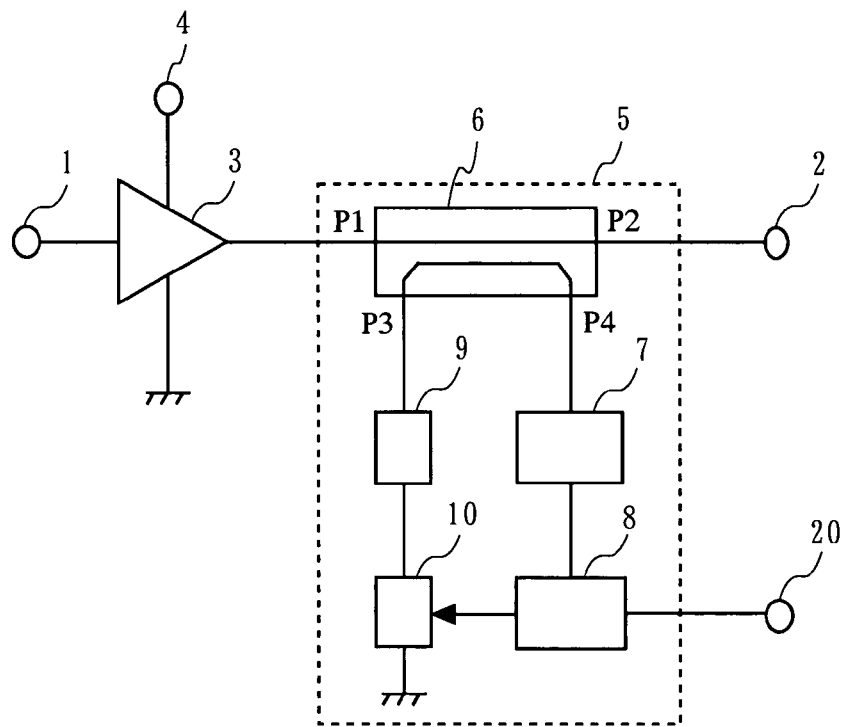
FIG. 1 is a block diagram of a portable terminal including a reflected power suppression circuit according to a first embodiment.

Hereinafter, with reference to the drawing, a reflected power suppression circuit according to a first embodiment of the present invention will be described. FIG. 1 is a block diagram of a portable terminal including the reflected power suppression circuit.

The portable terminal as shown in FIG. 1 includes an input terminal 1, an output terminal 2, a power amplifier 3, a power supply terminal 4, a reflected power suppression circuit 5, and a reference voltage input terminal 20. The reflected power suppression circuit 5 includes a directional coupler 6, a detection circuit 7, a control circuit 8, a termination resistor 9, and a switch circuit 10. The portable terminal is provided with the directional coupler 6 between the power amplifier 3 and the output terminal 2 in order to prevent high reflected power from being inputted to the power amplifier 3. A degree of coupling of the directional coupler 6 is controlled by the control circuit 8 based on the level of the reflected power. Hereinafter, each element of the portable terminal as shown in FIG. 1 will be described.

A transmission signal is inputted from the input terminal 1. The power amplifier 3 amplifies the transmission signal, and outputs the amplified signal. The output terminal 2 outputs the transmission signal amplified by the power amplifier 3. Note that the output terminal 2 is connected to an antenna (not shown). The power supply terminal 4 is a terminal through which power for driving the power amplifier 3 is supplied. The reflected power suppression circuit 5 prevents power reflected from the output terminal 2 from being inputted to the power amplifier 3. Hereinafter, with reference to the drawing, the details of the reflected power suppression circuit 5 will be described.

The directional coupler 6 is realized, for example, by a microstripline directional coupler, and causes a portion of power passing through a first path connecting the power amplifier 3 and the output terminal 2 to branch to a second path which is different from the first path. Specifically, the directional coupler 6 has four ports P1 to P4. The power amplifier 3 is connected to P1, and the transmission signal is inputted thereto. The output terminal 2 is connected to P2, and the transmission signal is outputted therefrom. The termination resistor 9 is connected to P3. The detection circuit 7 is connected to P4. Therefore, the above-described first path includes P1 and P2, and the above-described second path is connected to P4. As such, by connecting the directional coupler 6, a portion of the transmission signal and a portion of the reflected power passing through the above-described first path are outputted to the second path connected to P4. The level of the power outputted to the second path connected to P4 depends on the degree of coupling of the directional coupler 6. Specifically, when the degree of coupling is relatively high, relatively high power is outputted to the second path connected to P4. Hereinafter, the degree of coupling will be described in detail.

The degree of coupling indicates a proportion of power caused to branch to the second path to power passing through the first path. Specifically, when the degree of coupling is high, a proportion of power caused to branch to the second path from the first path is relatively high. The degree of coupling varies with an impedance of P3. Specifically, when the impedance of P3 coincides with the characteristic impedance, the degree of coupling rises to the maximum value, and the proportion of power caused to branch to the second path rises to the maximum value. That is, the level of the reflected power inputted to the power amplifier 3 is suppressed.

The termination resistor 9 is a resistor having the characteristic impedance of the directional coupler 6, and is realized by a 50 ohm resistor, for example. The detection circuit 7 detects the level of the branched power, thereby detecting the level of the reflected power. Specifically, the detection circuit 7 converts the branched power to a voltage signal having a voltage corresponding to the level of the branched power, and outputs the voltage signal to the control circuit 8. The control circuit 8 changes the degree of coupling of the directional coupler 6 according to the level of the reflected power. Specifically, the control circuit 8 controls ON/OFF of the switch circuit 10 based on a voltage value of the voltage signal, thereby controlling the degree of coupling of the directional coupler 6.

One end of the switch circuit 10 is connected to the termination resistor 9, and the other end is grounded. The switch circuit 10 switches between ON and OFF in accordance with a voltage value of the voltage signal outputted from the control circuit 8. When the switch circuit 10 is controlled to turn ON, the termination resistor 9 and the ground are electrically connected. On the other hand, when the switch circuit 10 is controlled to turn OFF, the termination resistor 9 and the ground are electrically disconnected. The control circuit 8 and the switch circuit 10 will be described below in detail.

A reference voltage having a predetermined level is inputted to the control circuit 8 via the reference voltage input terminal 20. The reference voltage is adjusted so as to coincide with a minimum level of a signal detected by the detection circuit 7 when the antenna is broken, for example. The control circuit 8 compares the magnitude of the reference voltage with the magnitude of the signal voltage outputted from the detection circuit 7. When the reference voltage is greater than the signal voltage, the control circuit 8 outputs a Low signal. On the other hand, when the signal voltage is greater than the reference voltage, the control circuit 8 outputs a High signal.

When the High signal is outputted from the control circuit 8, the switch circuit 10 is controlled to turn ON. Thus, the termination resistor 9 and the ground are electrically connected, and the impedance of P3 becomes a characteristic impedance (i.e., a Low impedance). As a result, the degree of coupling of the directional coupler 6 rises to the maximum value. On the other hand, when the Low signal is outputted from the control circuit 8, the switch 10 is controlled to turn OFF. Thus, the termination resistor 9 and the ground are electrically disconnected, and the impedance of P3 becomes greater than the characteristic impedance (i.e., a High impedance). As a result, the degree of coupling of the directional coupler 6 becomes relatively low.

Hereinafter, an operation of the above-described portable terminal as shown in FIG. 1 will be described. First, an operation performed by the portable terminal as shown in FIG. 1 when the antenna is not broken, for example.

First, in the initial state of the reflected power suppression circuit 5, the switch circuit 10 is controlled to be OFF state (shutoff state). Thus, the termination of the directional coupler 6 has a High impedance (OPEN), and the degree of coupling is reduced. As a result, a forward direction transition loss of the directional coupler 6 is reduced, and little or no transmission signal is branched to P4.

Next, when some period of time has elapsed after the portable terminal starts up (i.e., in a steady state), the power branched by the directional coupler 6 is sufficiently lower than the power branched when the antenna is broken, for example. Thus, a detection voltage, which is a voltage of the power detected by the detection circuit 7, is lower than the reference voltage. As a result, the control circuit 8 controls the switch circuit 10 to turn OFF.

Next, an operation performed by the portable terminal as shown in FIG. 1 when the reflected power from the output terminal 2 is increased due to breakage, etc., of the antenna will be described.

In this case, the reflected power inputted to P2 of the directional coupler 6 is increased. Thus, the power branched to P4 is increased compared to the steady state. As a result, the detection voltage detected by the detection circuit 7 is also increased. When the detection voltage is equal to or greater than the reference voltage, the control circuit 8 controls the switch circuit 10 to turn ON. Thus, the impedance of P3 of the directional coupler 6 becomes the characteristic impedance of the termination resistor 9 (i.e., 50 ohm), whereby the degree of coupling of the directional coupler 6 is increased. As a result, the amount of power branched to P4 by the directional coupler 6 is increased. The power branched to P4 is consumed by the detection circuit 7.

Note that, when the reflected power becomes equal to or lower than a predetermined value, that is, when the portable terminal recovers to the steady state, the reflected power suppression circuit 5 stops operating.

Figure 2:
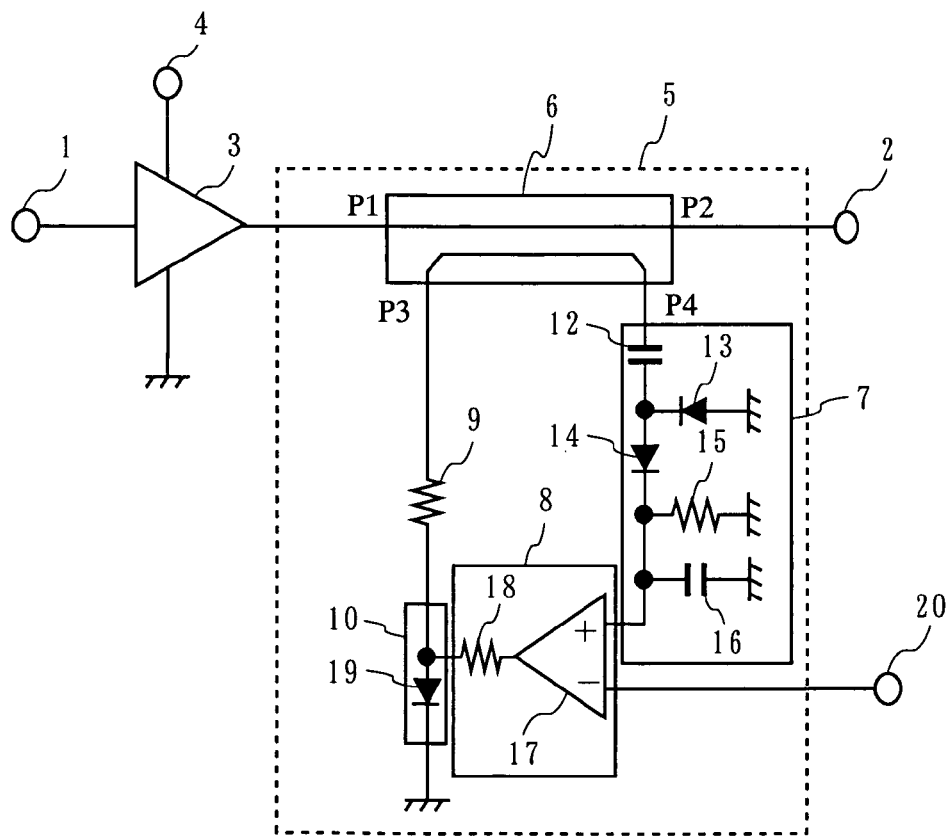
FIG. 2 is an illustration showing a specific circuit configuration of the portable terminal according to the first embodiment.

Here, with reference to the drawing, a specific circuit configuration of the portable terminal as shown in FIG. 1 will be described. FIG. 2 is an illustration showing a specific circuit configuration of the portable terminal.

The reflected power suppression circuit 5 included in the portable terminal as shown in FIG. 2 includes capacitors 12 and 16, diodes 13, 14, and 19, resistors 15 and 18, and an operational amplifier 17. Here, the detection circuit 7 comprises the capacitors 12 and 16, the diodes 13 and 14, and the resistor 15. The control circuit 8 comprises the operational amplifier 17 and the resistor 18. The switch circuit 10 comprises the diode 19.

The capacitor 12 and the diode 14 are connected in series. The cathode of the diode 13 is connected between the capacitor 12 and the diode 14. Note that the anode of the diode 13 is grounded. The cathode of the diode 14 is connected to one input of the operational amplifier 17. One end of the resistor 15 is connected between the diode 14 and the operational amplifier 17, whereas the other end thereof is grounded. Similarly, one end of the capacitor 16 is connected between the diode 14 and the operational amplifier 17, whereas the other end thereof is grounded.

A reference potential is applied to the other input of the operational amplifier 17. The resistor 18 is connected to the output of the operational amplifier 17. The resistor 18 is connected to one end of the termination resistor 9. Furthermore, the termination resistor 9 and the diode 19 are connected in series. The cathode of the diode 19 is grounded.

The capacitor 12 outputs only an AC component of the power branched by the directional coupler 6. The diode 14 detects the power, and converts the detected power to a voltage signal. The resistor 15 and the capacitor 16 smooth the voltage signal outputted from the diode 14. The operational amplifier 17 compares the reference voltage inputted from the reference voltage input terminal 20 with the above voltage signal. In the case where the voltage signal is greater than the reference voltage, the operational amplifier 17 outputs a High signal. On the other hand, in the case where the voltage signal is smaller than the reference voltage, the operational amplifier 17 outputs a Low signal. When the High signal is outputted from the operational amplifier 17, a forward bias is applied to the diode 19. As a result, the degree of coupling of the directional coupler 6 is increased, whereby the directional coupler 6 branches the power. On the other hand, when the Low signal is outputted from the operational amplifier 17, a reverse bias is applied to the diode 19. As a result, the forward direction transition loss of the directional coupler 6 is reduced.

As described above, according to the reflected power suppression circuit 5 as shown in FIG. 1, the degree of coupling of the directional coupler 6 is controlled based on the level of the reflected power. Specifically, when the level of the reflected power is greater than a predetermined value, the degree of coupling is controlled to become higher in order to prevent the reflected power from being inputted to the power amplifier 3. On the other hand, in the case where the level of the reflected power is equal to or smaller than the predetermined value, the degree of coupling is controlled to become lower since the reflected power can be inputted to the power amplifier 3 with little effect thereon. By performing the above-described control, the degree of coupling of the directional coupler 6 is increased in the case of breakage, etc., of the antenna, whereby the power amplifier 3 is prevented from being damaged. On the other hand, if there is no breakage, etc., of the antenna, the degree of coupling of the directional coupler 6 is reduced, whereby the power loss in the transmission direction is suppressed.

Figure 3:
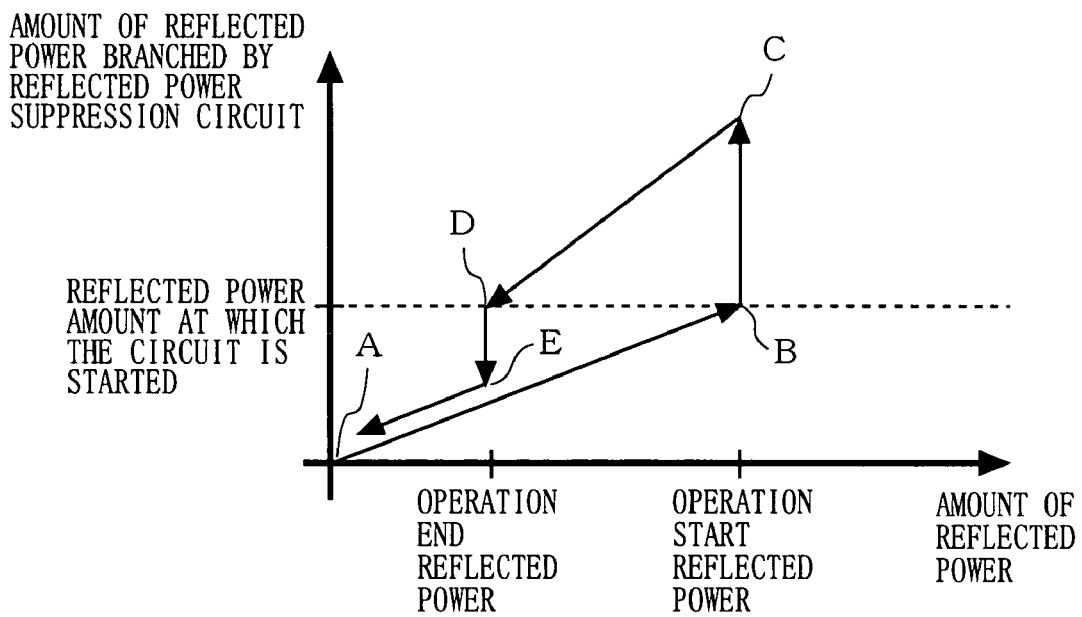
FIG. 3 is a graph showing a relationship between the amount of reflected power from an output terminal 2 and the amount of reflected power branched by a directional coupler 6.

A damage prevention function of the reflected power suppression circuit 5 has a hysteresis characteristic such that reflected power generated at the end of the operation is lower than reflected power generated at the start of the operation. Thus, even if the reflected power is in a neighborhood of a predetermined value, the reflected power suppression circuit 5 operates with high stability without the so-called chattering phenomenon. Hereinafter, with reference to the drawing, the above hysteresis characteristic will be described in detail. FIG. 3 is a graph showing a relationship between the amount of reflected power from the output terminal 2 and the amount of reflected power branched by the directional coupler 6. The vertical axis represents the amount of reflected power branched by the directional coupler 6. The horizontal axis represents the amount of reflected power from the output terminal 2.

As described above, in a steady state (point A) in which the reflected power is sufficiently low, the reflected power suppression circuit 5 does not operate. Thus, the termination of the directional coupler 6 for detection of reflected power keeps a High impedance, and the degree of coupling keeps low. The reflected power branched by the directional coupler 6 for detection of reflected power is increased proportionately with an increase in the reflected power caused by breakage, etc., of the antenna. When the reflected power exceeds a predetermined value (point B), the reflected power suppression circuit 5 starts to operate. As a result, the termination of the directional coupler 6 makes a transition to a state where the degree of coupling is high (from point B to point C).

After that, the reflected power suppression circuit 5 would continue operating unless the portable terminal returns to the steady state, and the power amplifier 3 is prevented from being damaged by a load change during all that time (between point C and point D).

When the portable terminal returns to the steady state and the reflected power is reduced to a level equal to or lower than a predetermined value (point D), the reflected power suppression circuit 5 stops operating. As a result, the termination of the directional coupler 6 returns to a state in which the degree of coupling is low (from point D to point E). If the reflected power is increased again at this point, the reflected power suppression circuit 5 starts operating (from point E to point C via point B), and the power amplifier 3 is prevented from being damaged by a load change. On the contrary, if the reflected power is further reduced at that point, the branched reflected power is also reduced and the portable terminal reaches the steady state, and the reflected power suppression circuit 5 stops operating (point A). Note that the slope of line AB, in which the reflected power suppression circuit 5 is operated, differs from the slope of line CD, in which the reflected power suppression circuit 5 is not operated, due to different degrees of coupling of the directional coupler 6.

As described above, the amount of reflected power at point D (operation end reflected power) at which the portable terminal recovers to the steady state is smaller than the amount of reflected power at point B (operation start reflected power). As a result, even if the amount of reflected power fluctuates near point B, the occurrence of chattering is reduced. Thus, it can be said that the reflected power suppression circuit 5 has a hysteresis characteristic which achieves stable operation.

Figure 4:
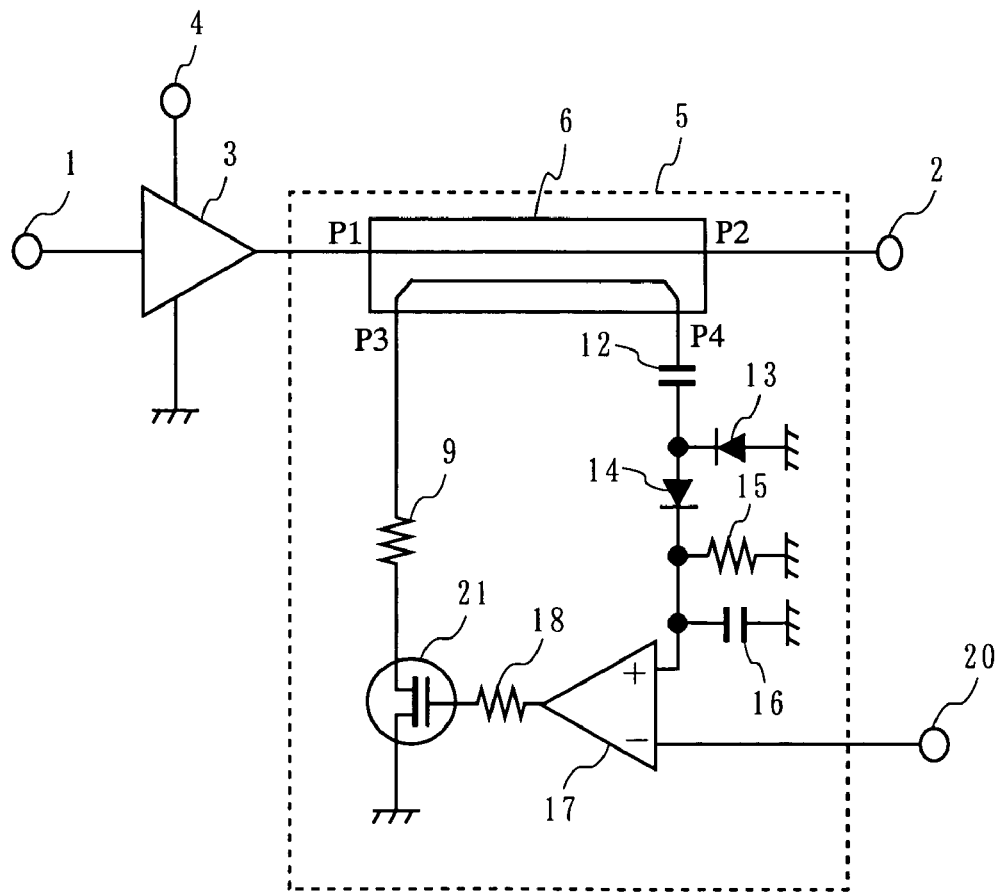
FIG. 4 is an illustration showing a specific circuit configuration of the portable terminal according to the first embodiment.
Figure 5:
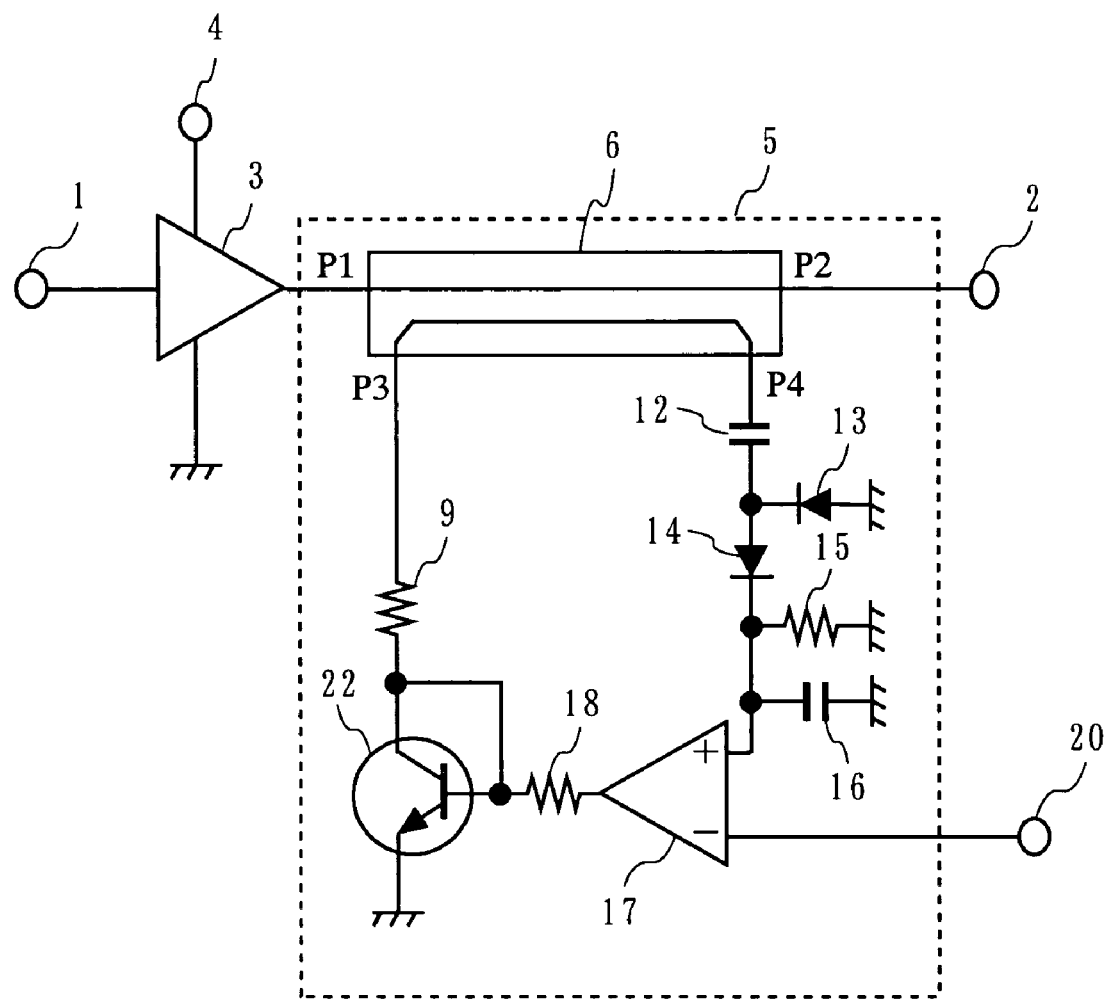
FIG. 5 is an illustration showing a specific circuit configuration of the portable terminal according to the first embodiment.

Note that, in the reflected power suppression circuit 5 as shown in FIG. 2, the diode 19 is used as the switch circuit 10, but it is not limited thereto. For instance, as shown in FIG. 4, an enhancement field effect transistor 21 may be used as the switch circuit 10. Alternatively, as shown in FIG. 5, a bipolar transistor 22 may be used as the switch circuit 10.

(Second Embodiment)

Figure 6:
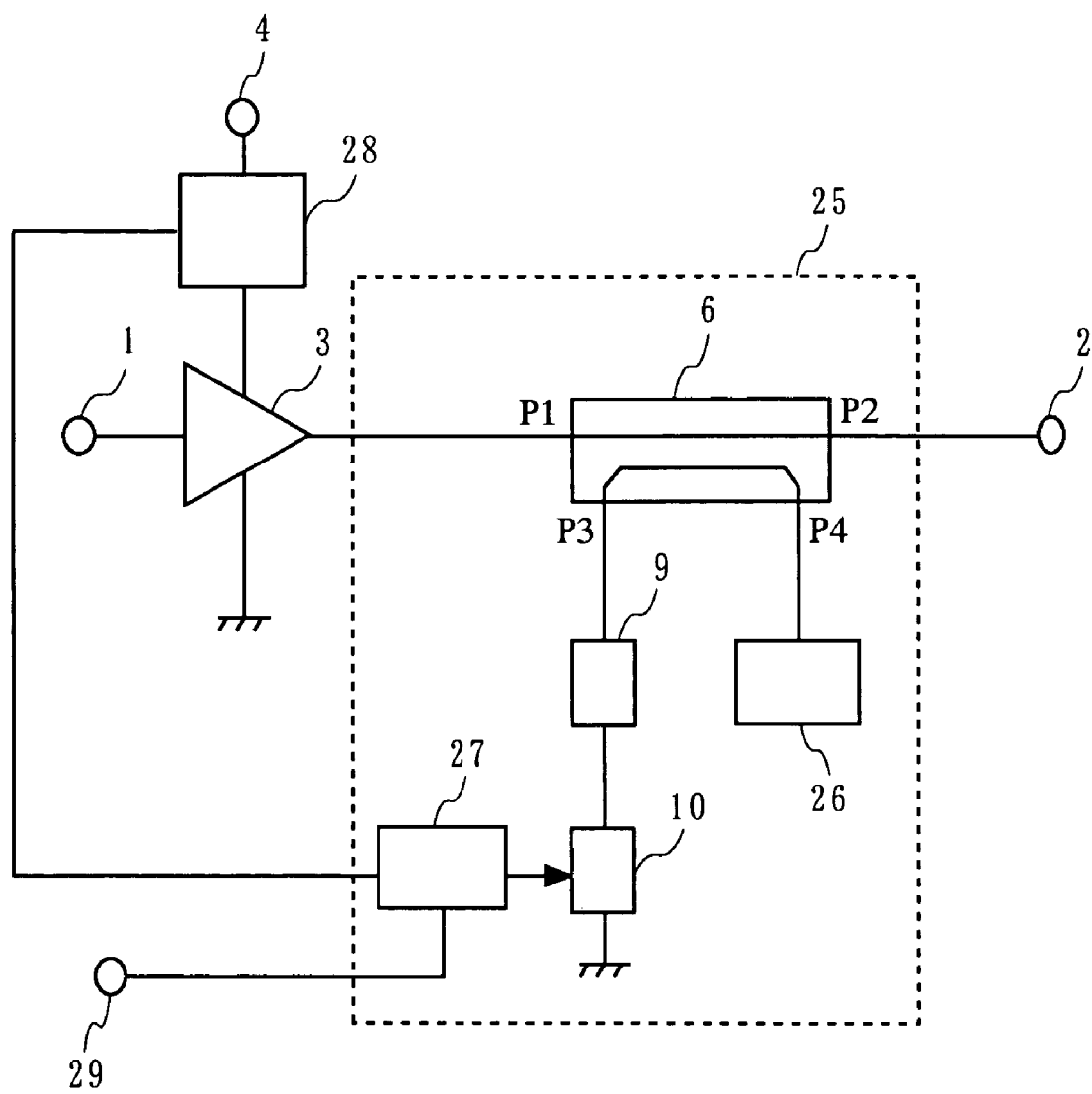
FIG. 6 is a block diagram of a portable terminal including a reflected power suppression circuit according to a second embodiment.

Hereinafter, with reference to the drawing, a reflected power suppression circuit according to a second embodiment of the present invention will be described. FIG. 6 is a block diagram of a portable terminal including the reflected power suppression circuit.

The portable terminal as shown in FIG. 6 includes the input terminal 1, the output terminal 2, the power amplifier 3, the power supply terminal 4, a reflected power suppression circuit 25, a current detection circuit 28, and a reference voltage input terminal 29. The reflected power suppression circuit 25 includes the directional coupler 6, the termination resistor 9, the switch circuit 10, a reflected power load circuit 26, and a control circuit 27. Here, the greater the reflected power inputted to the power amplifier 3 becomes, the greater the consumption current of the power amplifier 3 becomes. Therefore, it is possible to detect the level of the reflected power indirectly by detecting the consumption current. Thus, in the portable terminal according to the present invention, the level of the consumption current of the power amplifier 3 is detected by the current detection circuit 28, and the degree of coupling of the directional coupler 6 is controlled based on the detected consumption current. Hereinafter, each element of the portable terminal as shown in FIG. 6 will be described.

A transmission signal is inputted from the input terminal 1. The power amplifier 3 amplifies the transmission signal, and outputs the amplified signal. The output terminal 2 outputs the transmission signal amplified by the power amplifier 3. Note that the output terminal 2 is connected to an antenna (not shown). The power supply terminal 4 is a terminal through which power for driving the power amplifier 3 is supplied, and a direct current source such as a battery, etc., is connected thereto. The current detection circuit 28 detects consumption current of the power amplifier 3, and outputs a voltage corresponding to the consumption current. The reflected power suppression circuit 25 prevents power reflected from the output terminal 2 from being inputted to the power amplifier 3. Hereinafter, with reference to the drawing, the details of the reflected power suppression circuit 25 will be described.

The directional coupler 6 is realized, for example, by a microstripline directional coupler, and causes a portion of power passing through a first path connecting the power amplifier 3 and the output terminal 2 to branch to a second path which is different from the first path. Specifically, the directional coupler 6 has four ports P1 to P4. The power amplifier 3 is connected to P1, and the transmission signal is inputted thereto. The output terminal 2 is connected to P2, and the transmission signal is outputted therefrom. The termination resistor 9 is connected to P3. The reflected power load circuit 26 is connected to P4. Therefore, the above-described first path includes P1 and P2, and the above-described second path is connected to P4. As such, by connecting the directional coupler 6, a portion of the transmission signal and a portion of the reflected power passing through the above-described first path are outputted to the second path connected to P4. The level of the power outputted to the second path connected to P4 depends on the degree of coupling of the directional coupler 6. Specifically, when the degree of coupling is relatively high, relatively high power is outputted to the second path connected to P4. Hereinafter, the degree of coupling will be described in detail.

The reflected power load circuit 26 consumes the reflected power outputted to P4. The control circuit 27 changes the degree of coupling of the directional coupler 6 based on the intensity of the reflected power. Specifically, the control circuit 27 controls ON/OFF of the switch circuit 10 based on the output voltage of the current detection circuit 28, and controls the degree of coupling of the directional coupler 6. The termination resistor 9 is a resistor having a characteristic impedance of the directional coupler 6, and is realized by a 50 ohm resistor, for example. One end of the switch circuit 10 is connected to the termination resistor 9, and the other end is grounded. The switch circuit 10 switches between ON and OFF in accordance with a voltage value of the voltage signal outputted from the control circuit 27. When the switch circuit 10 is controlled to turn ON, the termination resistor 9 and the ground are electrically connected. On the other hand, when the switch circuit 10 is controlled to turn OFF, the termination resistor 9 and the ground are electrically disconnected. The control circuit 27 and the switch circuit 10 will be described below in detail.

A reference voltage having a predetermined level is inputted to the control circuit 27 via the reference voltage input terminal 29. The reference voltage is adjusted so as to coincide with a minimum value of the consumption current consumed by the power amplifier 3 when the antenna is broken, for example. The control circuit 27 compares the magnitude of the reference voltage with the magnitude of the output voltage from the current detection circuit 28. When the reference voltage is greater than output voltage, the control circuit 27 outputs a Low signal. On the other hand, when the output voltage is greater than the reference voltage, the control circuit 27 outputs a High signal.

When the Low signal is outputted from the control circuit 27, the switch circuit 10 is controlled to turn OFF. On the other hand, when the High signal is outputted from the control circuit 27, the switch circuit 10 is controlled to turn ON. Note that, when the switch circuit 10 is controlled to turn OFF, the termination of the directional coupler 6 has a High impedance, and the degree of coupling is reduced. On the other hand, when the switch circuit 10 is controlled to turn ON, the termination of the directional coupler 6 has a Low impedance, and the degree of coupling is increased.

Hereinafter, an operation of the above-described portable terminal as shown in FIG. 6 will be described. First, an operation performed by the portable terminal as shown in FIG. 6 when the antenna is not broken, for example, will be described.

First, in the initial state of the reflected power suppression circuit 25, the switch circuit 10 is controlled to be OFF state (shutoff state). Thus, the termination of the directional coupler 6 has a High impedance (OPEN), and the degree of coupling is reduced. As a result, a forward direction transition loss of the directional coupler 6 is reduced, and little or no transmission signal is branched to P4.

Next, when some period of time has elapsed after the portable terminal starts up (i.e., in a steady state), the power branched by the directional coupler 6 is sufficiently lower than the power branched when the antenna is broken, for example. Thus, the output voltage from the current detection circuit 28 is lower than the reference voltage. As a result, the control circuit 27 controls the switch circuit 10 to turn OFF.

Next, an operation performed by the portable terminal as shown in FIG. 6 when the reflected power from the output terminal 2 is increased due to breakage, etc., of the antenna will be described.

In this case, the reflected power inputted to P2 of the directional coupler 6 is increased. Accordingly, the reflected power inputted to the power amplifier 3 is increased. The level of the consumption current of the power amplifier 3 is increased with an increase in the level of the reflected power inputted to the power amplifier 3. As a result, the output voltage outputted from the current detection circuit 28 is also increased. When the output voltage becomes equal to or greater than the reference voltage, the control circuit 27 controls the switch circuit 10 to turn ON. Thus, the impedance of P3 of the directional coupler 6 coincides with the characteristic impedance (i.e., 50 ohm) of the termination resistor 9, whereby the degree of coupling of the directional coupler 6 is increased. As a result, the amount of power branched to P4 by the directional coupler 6 is increased. The power branched to P4 is consumed by the reflected power load circuit 26, whereby the reflected power with high intensity is prevented from being inputted to the power amplifier 3.

Note that, when the reflected power becomes equal to or smaller than a predetermined value, that is, the portable terminal recovers to the steady state, the reflected power suppression circuit 25 stops operating.

As described above, according to the portable terminal of the present embodiment, the amount of branched reflected power is controlled by the reflected power suppression circuit 25. Specifically, in the case where the reflected power is increased, the amount of branched power is increased for reducing the reflected power to be inputted to the power amplifier 3. As a result, it is possible to prevent deterioration of VSWR (Voltage Standing Wave Ratio) seen from the output side of the power amplifier 3, and prevent damage of the power amplifier 3 caused by a load change.

Also, unless the amount of consumption current of the power amplifier 3 is reduced to a level equal to or smaller than a predetermined value by improvement of a load change, that is, unless the portable terminal recovers to the steady state, the reflected power suppressing circuit 25 continues operating, and the power amplifier 3 is prevented from being damaged by a load change during all that time.

Figure 7:
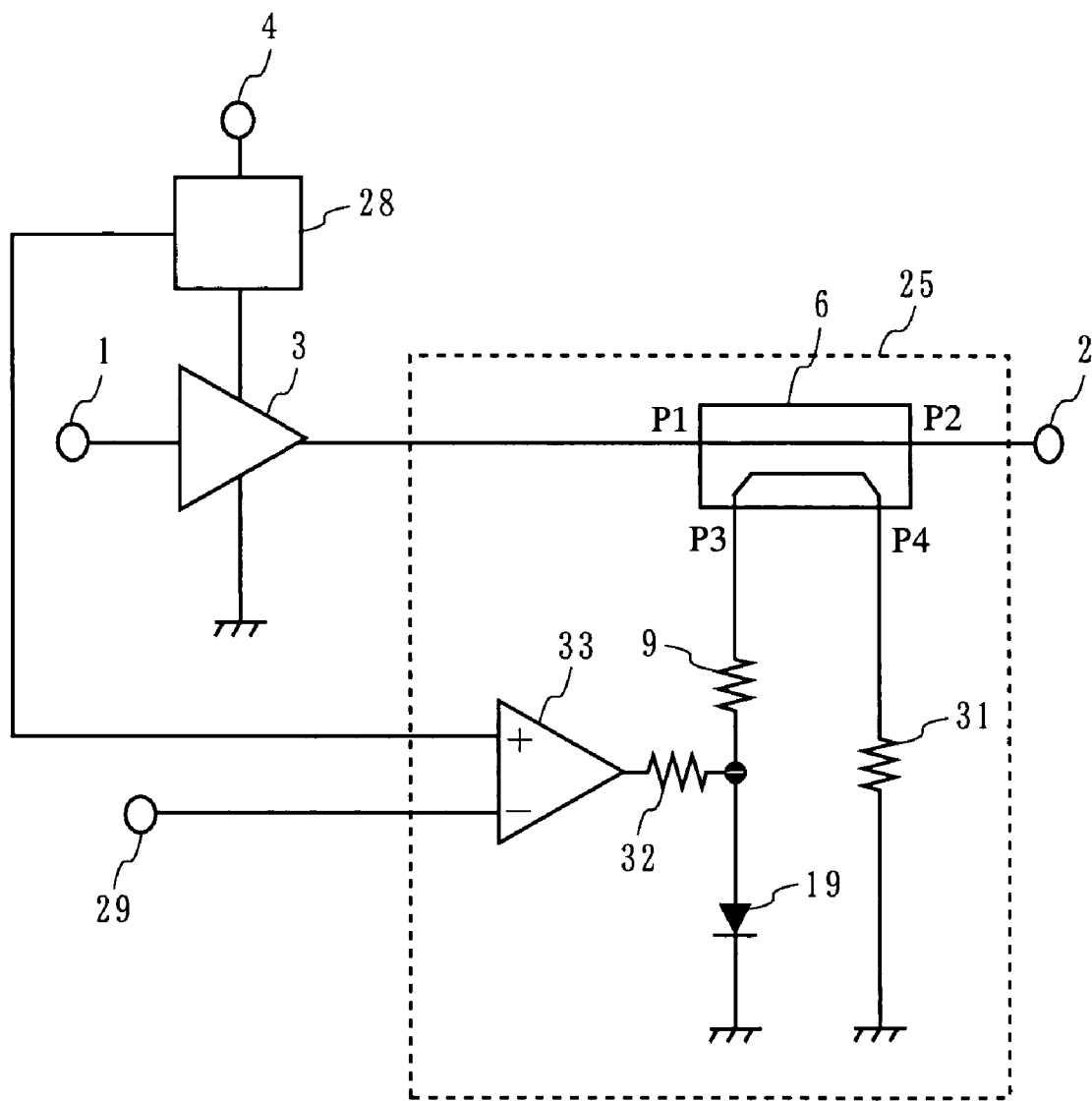
FIG. 7 is an illustration showing a specific circuit configuration of the portable terminal according to the second embodiment.
Figure 8:
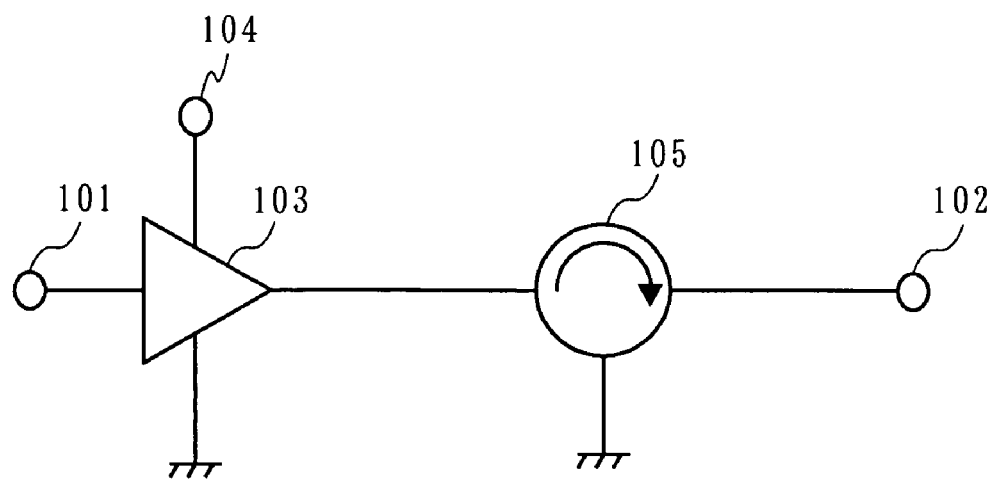
FIG. 8 is a block diagram showing a configuration of a conventional portable terminal.
Figure 9:
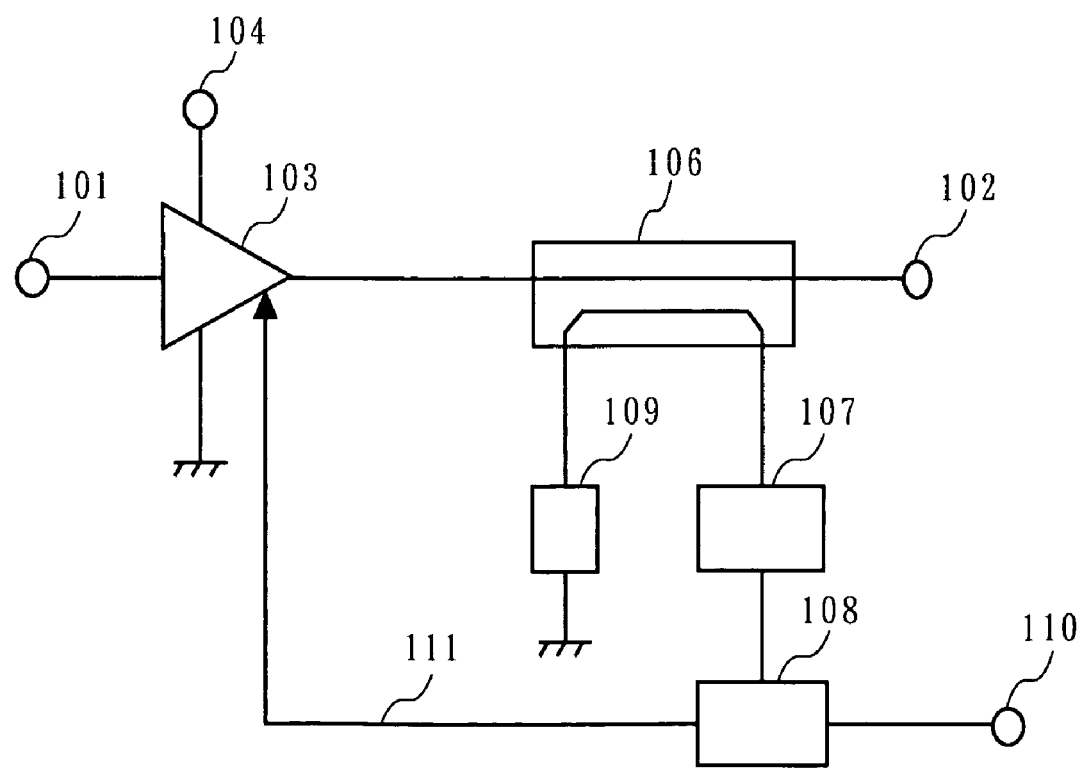
FIG. 9 is a block diagram showing a configuration of a conventional portable terminal.

Next, with reference to the drawing, a specific circuit configuration of the portable terminal as shown in FIG. 6 will be described. FIG. 7 is an illustration showing a specific circuit configuration of the portable terminal.

The reflected power suppressing circuit 25 as shown in FIG. 7 includes the termination resistor 9, the diode 19, resistors 31 and 32, and an operational amplifier 33. Here, the termination resistor 31 comprises the reflected power load circuit 26. The resistor 32 and the operational amplifier 33 comprise the control circuit 27. The diode 19 comprises the switch circuit 10.

One end of the resistor 31 is connected to P4 of the directional coupler 6, and the other end is grounded. One end of the termination resistor 9 is connected to P3 of the directional coupler 6, and the other end is connected to the anode of the diode. 19. The cathode of the diode 19 is grounded. The output of the operational amplifier 33 is connected between the termination resistor 9 and the diode 19 via the resistor 32. The output of the current detection circuit 28 is connected to one input of the operational amplifier 33. The reference voltage input terminal 29 is connected to the other input of the operational amplifier 33, and a reference voltage is applied thereto.

The operational amplifier 33 compares the reference voltage inputted from the input of the reference voltage input terminal 29 with the output voltage from the current detection circuit 28. In the case where the output voltage is greater than the reference voltage, the operational amplifier 33 outputs a High signal. On the other hand, in the case where the output voltage is smaller than the reference voltage, the operational amplifier 33 outputs a Low signal. In the case where the High signal is outputted from the operational amplifier 33, a forward bias is applied to the diode 19. As a result, the degree of coupling of the directional coupler 6 becomes high, whereby the directional coupler 6 branches the power to P4. The branched power is consumed by the resistor 31. On the other hand, in the case where the Low signal is outputted from the operational amplifier 33, a reverse bias is applied to the diode 19. As a result, the forward direction transition loss of the directional coupler 6 is reduced.

Note that, as is the case with the first embodiment, in the reflected power suppression circuit according to the present embodiment, the enhancement field effect transistor 21 or the bipolar transistor 22 may be used as the switch circuit 10.

Note that, as is the case with the first embodiment, the reflected power suppression circuit according to the present embodiment has the same hysteresis characteristic.

The reflected power suppression circuit according to the present invention is capable of facilitating size reduction and preventing a power amplifier from being damaged due to breakage, etc., of an antenna, while minimizing a power loss at the time of signal transmission. The reflected power suppression circuit according to the present invention is useful as a circuit for preventing power reflected from the antenna from being inputted to the power amplifier.

While the invention has been described in detail, the foregoing description is in all aspects illustrative and not restrictive. It is understood that numerous other modifications and variations can be devised without departing from the scope of the invention.

What is claimed is:

1. A reflected power suppression circuit comprising:
   an amplifier for amplifying a transmission signal and outputting the amplified signal to an antenna;
   a directional coupler for causing a portion of power passing through a first path connecting the amplifier and the antenna to branch to a second path which is different from the first path;
   a detection section for detecting an electrical parameter changing with a change in an intensity of power reflected from the antenna to the amplifier to detect the intensity of the reflected power; and
   a control section for changing a proportion of the power caused to branch to the second path by the directional coupler, based on the electrical parameter detected by the detection section.

2. The reflected power suppressing circuit according to claim 1, wherein the detection section detects the intensity of the reflected power by detecting an intensity of power caused to branch to the second path by the directional coupler.

3. The reflected power suppression circuit according to claim 2,
   wherein the detection section detects the intensity of the reflected power by converting the power caused to branch to the second path by the directional coupler to a voltage signal having a voltage value corresponding to the intensity of the branched power and detecting the voltage value of the voltage signal, and
   wherein the control section comprises:
      a resistor electrically connected to the directional coupler to be used as a termination resistor and having a characteristic impedance, with which a proportion of power caused to branch to the second path by the directional coupler is maximized;
      a comparison section for comparing a voltage value of the voltage signal detected by the detection section with a predetermined voltage value so as to output a first control signal when the obtained voltage value is greater than the predetermined voltage value, and output a second control signal when the predetermined voltage value is greater than the obtained voltage value; and
      a switch for electrically connecting the directional coupler and the resistor when the first signal is outputted from the comparison section, and electrically disconnecting the directional coupler and the resistor when the second control signal is outputted from the comparison section.

4. The reflected power suppression circuit according to claim 3, wherein the switch comprises a diode.

5. The reflected power suppression circuit according to claim 3, wherein the switch comprises a field effect transistor.

6. The reflected power suppression circuit according to claim 3, wherein the switch comprises a bipolar transistor.

7. The reflected power suppression circuit according to claim 1, wherein the detection section detects the intensity of the reflected power by detecting a level of a consumption current provided to the amplifier.

8. The reflected power suppression circuit according to claim 7,
   wherein the detection section outputs a voltage signal corresponding to a level of the consumption current, and
   wherein the control section comprises:
      a resistor electrically connected to the directional coupler to be used as a termination resistor and having a characteristic impedance, with which a proportion of power caused to branch to the second path by the directional coupler is maximized;
      a comparison section for comparing a voltage value of the voltage signal detected by the detection section with a predetermined voltage value so as to output a first control signal when the obtained voltage value is greater than the predetermined voltage value, and output a second control signal when the predetermined voltage value is greater than the obtained voltage value; and
      a switch for electrically connecting the directional coupler and the resistor when the first signal is outputted from the comparison section, and electrically disconnecting the directional coupler and the resistor when the second control signal is outputted from the comparison section.

* * * * *